United States Patent
Liu et al.

(10) Patent No.: US 6,756,275 B1
(45) Date of Patent: Jun. 29, 2004

(54) METHOD FOR MINIMIZING PRODUCT TURN-AROUND TIME FOR MAKING SEMICONDUCTOR PERMANENT STORE ROM CELL

(75) Inventors: Kwo-Jen Liu, San Jose, CA (US); Chih-Hung Chen, Hsin-Chu (TW); An-Ru Cheng, Hsin-Chu (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 10/249,286

(22) Filed: Mar. 28, 2003

(51) Int. Cl.$^7$ .......................................... H01L 21/8236
(52) U.S. Cl. ........................................................ 438/278
(58) Field of Search ................................ 438/276–278

(56) References Cited

U.S. PATENT DOCUMENTS

| | | | |
|---|---|---|---|
| 4,268,950 A | | 5/1981 | Tasch et al. |
| 4,365,405 A | * | 12/1982 | Dickman et al. ............ 438/278 |
| 5,514,609 A | | 5/1996 | Kau et al. |
| 6,020,241 A | | 2/2000 | Chu et al. |
| 6,133,100 A | * | 10/2000 | Li ................................ 438/275 |
| 6,380,016 B2 | * | 4/2002 | Kohler ........................ 438/200 |
| 6,689,663 B1 | * | 2/2004 | Chang et al. ................ 438/275 |

* cited by examiner

*Primary Examiner*—Chandra Chaudhari
*Assistant Examiner*—David S. Blum
(74) *Attorney, Agent, or Firm*—Winston Hsu

(57) ABSTRACT

A method for manufacturing a ROM device includes a semiconductor substrate having an array of field-effect transistors within a ROM region. A first dielectric layer covers the array of field-effect transistors. All of the field-effect transistors are initially in an "ON" state having a threshold voltage at a first value. At least one layer of metal interconnection is formed over the first dielectric layer within the ROM region and Is covered by a second dielectric layer. A coding photoresist layer is formed on the second dielectric layer and patterned to form a plurality of apertures defining exposure windows. Using the patterning coding photoresist layer as a dielectric etching and implantation hard mask, the underlying field-effect transistors to be coded permanently to a logic "OFF" state through the apertures, thereby raising the threshold voltage of the field-effect transistors to a second value.

14 Claims, 10 Drawing Sheets

METHOD FOR MINIMIZING PRODUCT TURN-AROUND TIME FOR MAKING SEMICONDUCTOR PERMANENT STORE ROM CELL

BACKGROUND OF THE INVENTION

1. Field of the Invention

The present invention relates generally to a method for manufacturing read only memory (ROM) devices. More specifically, a method is disclosed for minimizing the product turn-around time for making semiconductor permanent store ROM cells with small cell size. This invention particularly involves the use of boron implantation through single or multi-level metal interconnections, which are formed within a ROM region.

2. Description of the Prior Art

Read-only memory (ROM), also known as firmware, is an integrated circuit programmed with specific data when it is manufactured. ROM chips are used not only, in computers, but in most other electronic items as well. The process of programming data is also referred to as coding. Hitherto, numerous coding methods have been developed to program data into the memory cells during different phases of their manufacture. One development that has gained wide use is the threshold voltage implant method, which changes a transistor's threshold voltage by ion implanting the transistor gates for programmed cells. By way of example, for coding an N-channel memory cell, a predetermined dosage of impurities such as boron are implanted into the channel area under the gate of the transistor to raise its threshold voltage, thereby turning this memory cell into an "off" state.

It is often desirable to apply the ROM code onto the partially completed devices during a latter part of the manufacturing process. By applying the code at the latter part of the process, it takes less time to complete wafer processing. Customers require the product turn-around time between receipt of the ROM code for a custom order and delivery of finished parts to be kept as short as possible. Less time for completion means a shorter product turn-around time.

U.S. Pat. No. 4,268,950, filed Jun. 5, 1978 by Chatterjee et al., assigned to Texas Instruments discloses a process for making an N-channel silicon gate MOS read only memory that may be programmed at a late stage in the manufacturing process. The cell array is programmed by boron implantation through a protective nitride, polysilicon strips, and gate oxides to raise the threshold voltage of selected cells to a value above that which will be turned on by the voltage on the selected address line. According to U.S. Pat. No. 4,268,950, no metal lines are used in the cell array, only in the peripheral areas.

U.S. Pat. No. 5,514,609, filed May 13, 1994 by Chen et al., assigned to Mosel Vitelic discloses the manufacture of a ROM cell that is coded before metallization. ROM code impurities are implanted first through a dielectric layer overlying gate electrodes, and then through the underlying selected gate electrodes.

U.S. Pat. No. 6,020,241, filed Dec. 22, 1997 by You et al., assigned to Taiwan Semiconductor Manufacturing Company discloses a method of manufacturing a ROM that is code implanted late in the process after the first level metal thus reducing the turn-around time to ship a customer order. It is noted that the first level metal is not formed in the cell areas, but is formed over the peripheral areas. The code implantation implants impurities through a first dielectric layer overlying gates and a second dielectric layer overlying the first dielectric layer, and through a portion of the word lines.

For today's high-density ROM device, to reach a highest packing density, some metal interconnections such as bit lines are inevitably formed within the memory array area overlying word lines, instead of buried diffusion bit lines in the substrate as disclosed in the prior art, which occupy a lot of chip area. However, none of the above-mentioned prior art references teaches a method capable of coping with difficulties that occur when coding a ROM integrated circuit device having multilevel metal interconnections formed within the ROM region or cell array area while maintaining a short product turn-around time.

SUMMARY OF THE INVENTION

It is therefore a primary objective of this invention to provide a method for manufacturing high-density read only memory (ROM) devices that may be programmed at a selected level of multilevel metal interconnections that are formed within the ROM region, thereby shortening the product turn-around time.

It is a further objective of this invention to provide a method for manufacturing high-density read only memory (ROM) devices that involves the use of relatively high energy ion implantation to program selected transistors though multilevel metal interconnections, Inter-layer dielectric (ILD), polysilicon gates, and gate oxides.

Briefly summarized, the preferred embodiment of the present invention discloses a method for manufacturing a read only memory (ROM) device capable of shortening product turn-around time. The ROM device includes a semiconductor substrate having thereon an array of enhancement-mode metal-oxide-semiconductor field-effect transistors (MOSFETs) within a ROM region and a first dielectric layer covering the MOSFETs within the ROM region. Each of the MOSFETs has a polysilicon gate, a source, a drain, and a gate oxide between the polysilicon gate and the substrate. All of the MOSFETs are initially in a logic "0", state at a first threshold voltage. After planarizing the first dielectric layer, m layers of metal interconnections are formed over the first dielectric layer within ROM region. According to the first preferred embodiment of the present invention, the top layer of the m layers of metal interconnections (m-th layer metal) within the ROM region is further covered by a top inter-metal dielectric (IMD) layer corresponding to the IMD layer of the m+1 layer metal interconnection that is fabricated in the peripheral area. According to the second preferred embodiment of the present invention, the top layer of the m layers of metal interconnections is covered by a plurality of IMD layers each of which corresponds to one of the IMD layers from the m+1 layer to the Xth layer metal interconnections that are fabricated in the peripheral area.

In accordance with the first preferred embodiment of the present invention, the method generally includes the steps of: forming a mask layer on the top IMD layer, the mask layer having an opening exposing the entire ROM region; etching away a thickness of the top IMD layer through the opening without exposing the top layer of the m layers of metal interconnections to form a recess over the ROM region; removing the mask layer; forming a coding photoresist layer on the remaining top IMD layer in the recess; patterning the coding photoresist layer to form a plurality of apertures defining exposure windows where the underlying MOSFETs are to be coded from the logic "0" state into a logic "1" state; using the patterning coding photoresist layer as an implant hard mask to implant the underlying MOSFETs to be coded through the apertures, m layers of metal interconnections, polysilicon gates, and gate oxides into the substrate, thereby transforming the MOSFETs to be coded into the logic "1" state at a second threshold voltage, wherein the second threshold voltage is higher than the first threshold voltage; and stripping the coding photoresist layer.

In accordance with the second preferred embodiment of the present invention, the method includes forming a mask layer on the plurality of IMD layers. The mask layer has an opening exposing the entire ROM region. A thickness of the plurality of IMD layers is etched away through the opening without exposing the top layer of the m layers of metal interconnections to form a recess over the ROM region. The mask layer is removed. A coding photoresist layer is formed on the remaining top IMD layer in the recess. The coding photoresist layer is then patterned to form a plurality of apertures defining exposure windows where the underlying MOSFETs are to be coded from the logic "0" state into a logic "1" state. The patterning coding photoresist layer is used as an implant hard mask to implant the underlying MOSFETs to be coded through the apertures, m layers of metal interconnections, polysilicon gates, and gate oxides into the substrate, thereby transforming the MOSFETs to be coded into the logic "1" state at a second threshold voltage, wherein the second threshold voltage is higher than the first threshold voltage; and stripping the coding photoresist layer.

According to one aspect of the present invention, an alternative method for manufacturing a ROM device is disclosed. A semiconductor substrate having thereon an array of field-effect transistors within a ROM region is provided. A first dielectric layer covers the array of field-effect transistors. All of the field-effect transistors are initially in an "ON" state having a threshold voltage at a first value. Over the first dielectric layer within the ROM region, m layers of metal interconnections are formed. The m layers of metal interconnections are further covered by composite dielectric layers. The composite dielectric layers are introduced for the remaining metal isolation after m-th layer are formed in the peripheral area. The device is held awaiting the details of a custom's order, which will determine the exact configuration of the code implantation. A coding photoresist layer is then formed on the composite dielectric layers. The coding photoresist layer is patterned to form a plurality of apertures defining exposure windows where the underlying field-effect transistors are to be coded permanently to an "OFF" state. Using the patterned coding photoresist layer as a dielectric etching mask and also animplant hard mask, a thickness of the composite dielectric layers is etched away through the apertures, and the underlying field-effect transistors to be coded are then code implanted through the apertures, the layer of metal interconnections, polysilicon gates, and gate oxides into the substrate, thereby raising the threshold voltage of the field-effect transistors to be coded to a second value.

In short, according to the present invention, the ROM code implantation may be accomplished through either a 2-mask procedure or a single-mask procedure. The 2-mask procedure includes the use of a first mask defining one big opening through which the composite dielectric is etched back to the m-th layer. The second mask is used to pattern the ROM code with many small openings. Each small opening represents a program address for each individual ROM memory cell to logic "1" state. Alternatively, the ROM code implantation may be accomplished through single-mask procedure, in which the ROM code is defined with many small openings omitting the first mask. This means that etching of the dielectric and code implanting are carried out through the same code openings. It is advantageous to use the 2-mask procedure since the product turn-around time is shorter than that of using single-mask procedure. After etching the composite dielectric with the first mask,the ROM device is stored and kept in the state awaiting the customer code mask. There is no etching step after receiving the customer code mask. On the other hand,the single-mask method requires both etch and implantation with the same mask after receiving the customer code mask. It is a trade off when choosing one between the 2-mask and single-mask methods because using single-mask method results in reduced cost (only one mask) but relatively longer turn around time.

Other objects, advantages, and novel features of the claimed invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The preferred embodiment in accordance with the present invention will be discussed in detail with reference to FIG. 1 to FIG. 6. It is understood that the type of semiconductor regions, device layout, and polarity of voltages are chosen solely for illustration, and persons having ordinary skill in the art would recognize other alternatives, variations, and modifications.

Figure 1:
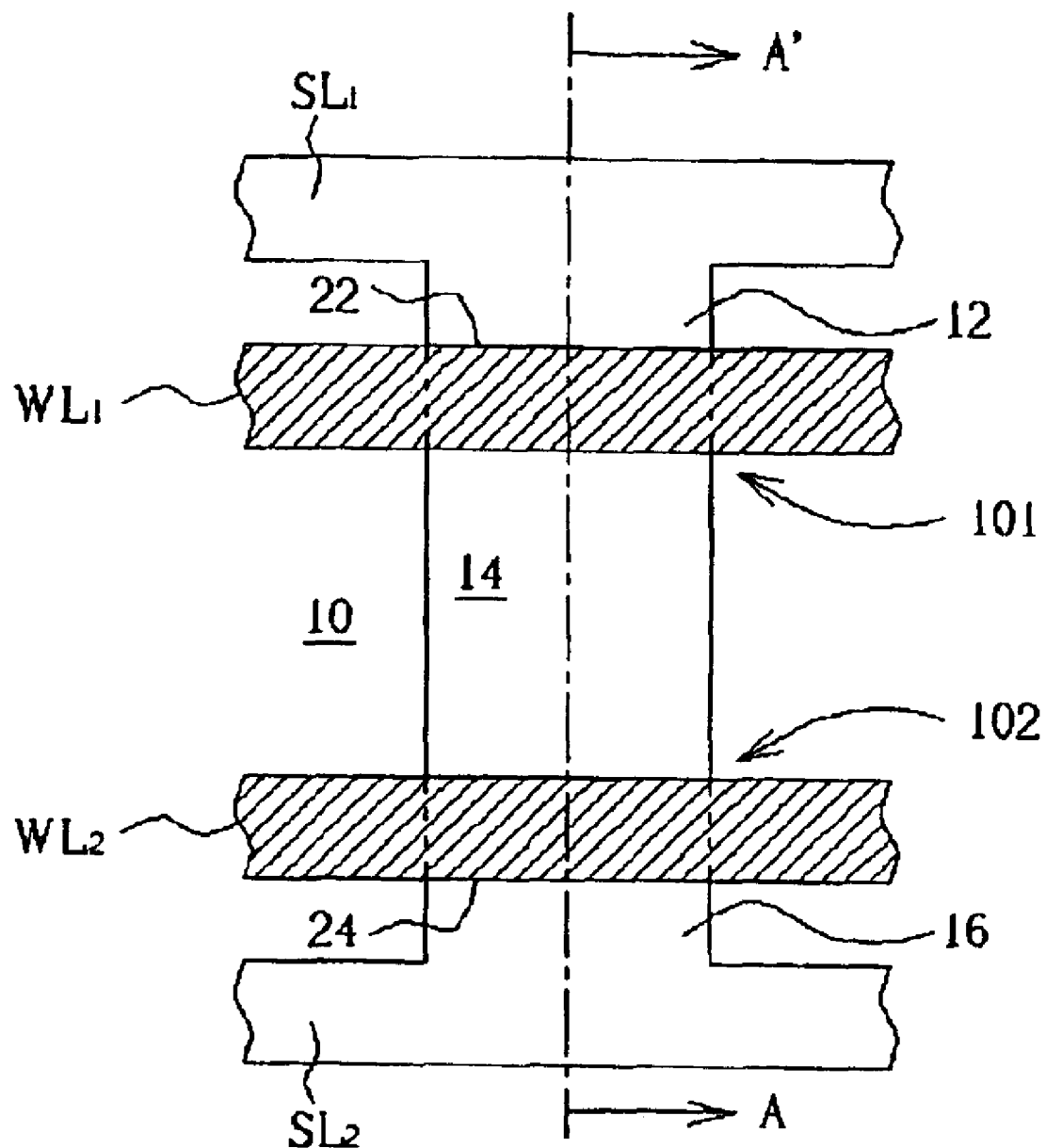
FIG. 1 is an enlarged planar view of a read only memory layout, before first level metallization, according to the present invention.
Figure 2:
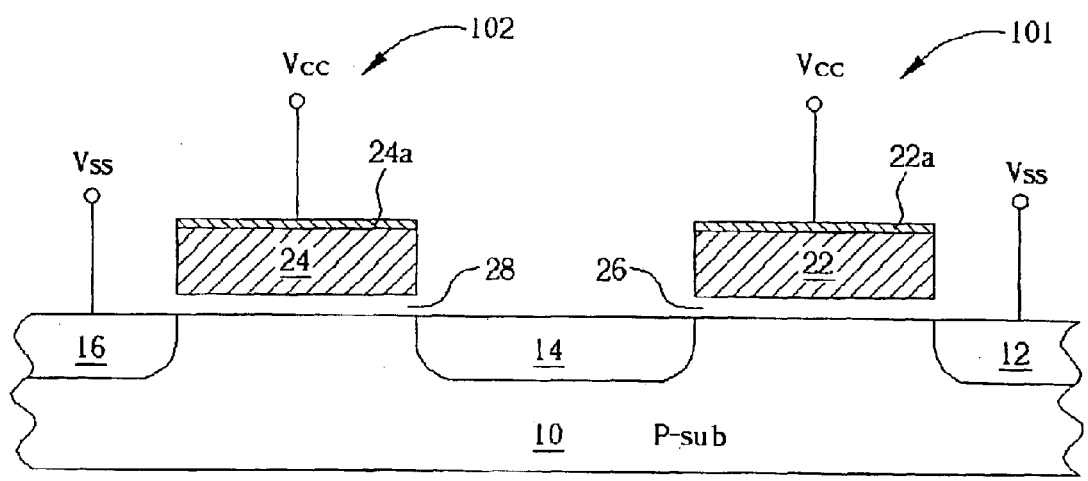
FIG. 2 is a schematic, cross-sectional view of FIG. 1 along line AA".

Please refer to FIG. 1 and FIG. 2, where FIG. 1 is an enlarged planar view of a read only memory, or ROM device layout, before first level metallization according to the present invention, and FIG. 2 is a schematic, cross-sectional view of FIG. 1 along line AA". As shown in FIG. 1 and FIG. 2, a portion of memory array is illustrated, which is programmed according to the present invention. The ROM array, which may be a 64M ROM, 128M ROM, or the like, consists of a huge number of memory cells, only two of which are shown for simplicity. According to the preferred embodiment of this invention, the ROM unit comprises two connected cells 101 and 102. The cell 101 is an N-channel MOS field-effect transistor having a gate 22, a source 12, and a drain 14. A thin gate oxide 26 is disposed under the gate 22. The cell 102 is an N-channel MOS field-effect transistor having a gate 24, a source 16, and the drain 14. A thin gate oxide 28 Is disposed under the gate 24. The cells 101 and 102 share the drain region 14 and are thus connected to each other, thereby shrinking the dimension of the ROM unit. Both of the cells 101 and 102 are initially in an "ON" state at a first threshold voltage. The gates 22 and 24 are parts of word lines (or X address lines) $WL_1$ and $WL_2$, respectively. The sources 12 and 16 are electrically connected to source lines $SL_1$ and $SL_2$, respectively. According to the preferred embodiment, the source lines $SL_1$ and $SL_2$ are N-type buried diffusion lines formed in a P-type semiconductor substrate 10. Preferably, self-aligned silicide (salicide) layers 22a and 24a, which reduce resistance of the word lines, are provided on the top surfaces of the gates 22 and 24, respectively. In operation, the sources 12 and 16 are biased to ground or Vss, the gates 22 and 24 are biased to Vcc.

Figure 3:
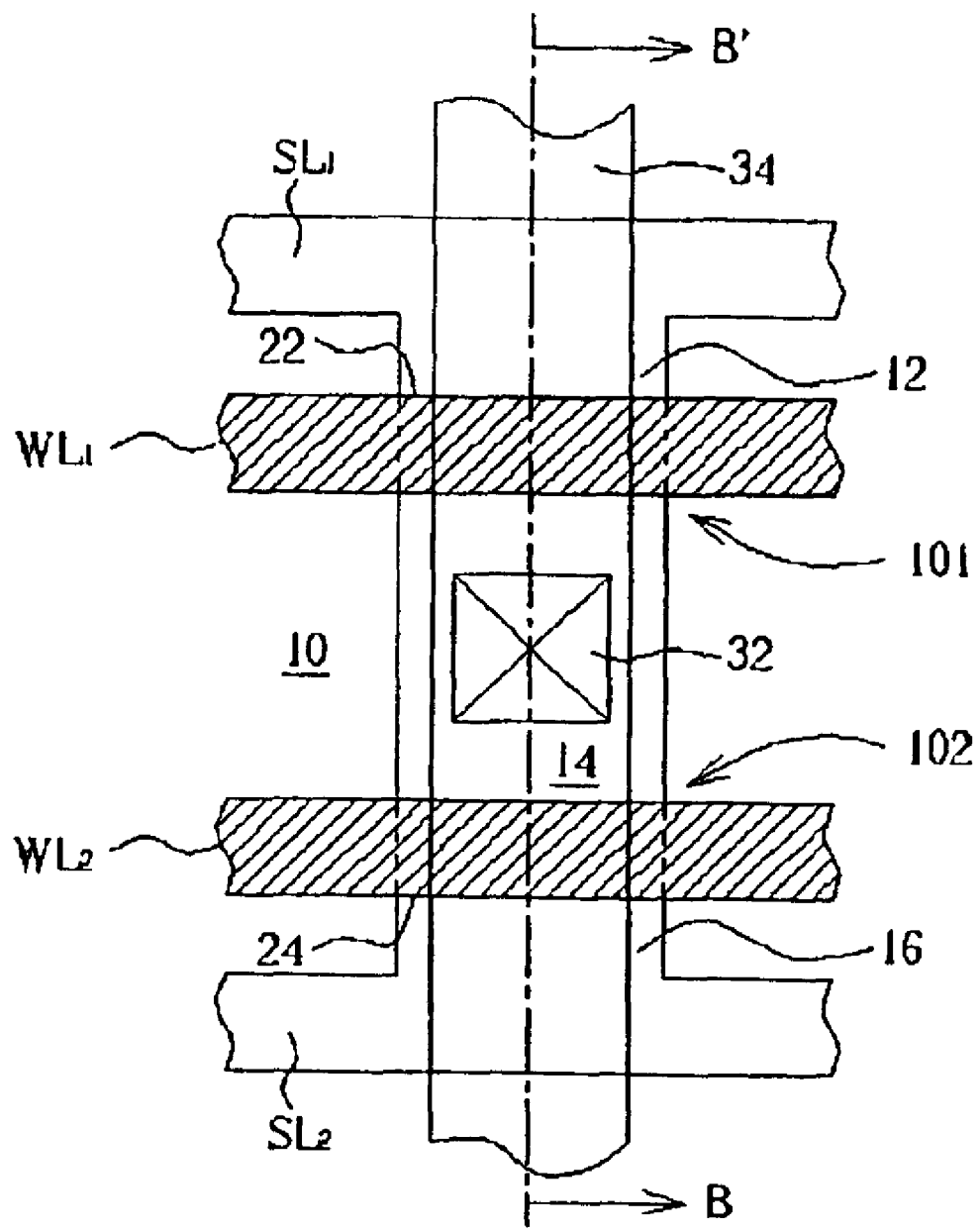
FIG. 3 is an enlarged planar view of the ROM unit layout, after first level metallization according to the present invention.
Figure 4:
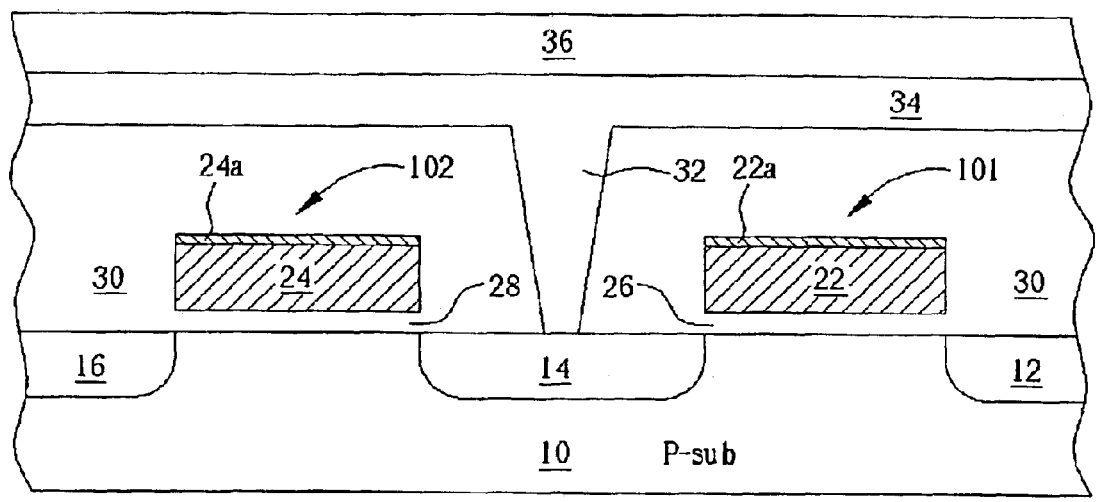
FIG. 4 is a schematic, cross-sectional view of FIG. 3 along line BB".

Please refer to FIG. 3 and FIG. 4. FIG. 3 is an enlarged planar view of the ROM unit layout, after first level metallization according to the present invention. FIG. 4 is a schematic, cross-sectional view of FIG. 3 along line BB". As shown in FIG. 3 and FIG. 4, a 3000–8000 angstrom thick dielectric layer 30 such as BPSG is deposited overlying the ROM unit and planarized. A metal bit line (or Y output line) 34 is patterned on the dielectric layer 30 and is electrically connected to the drain 14 through a contact 32 that is formed in the dielectric layer 30. The formation of contact and bit line pattern is known in the art and the details are thus omitted. A dielectric layer or passivation 36 is then deposited on the bit line 34 and on the dielectric layer 30. After this, the semiconductor device is stored or "banked". The device is held awaiting the details of a custom"s order, which will determine the exact configuration of the code implant.

Figure 5:
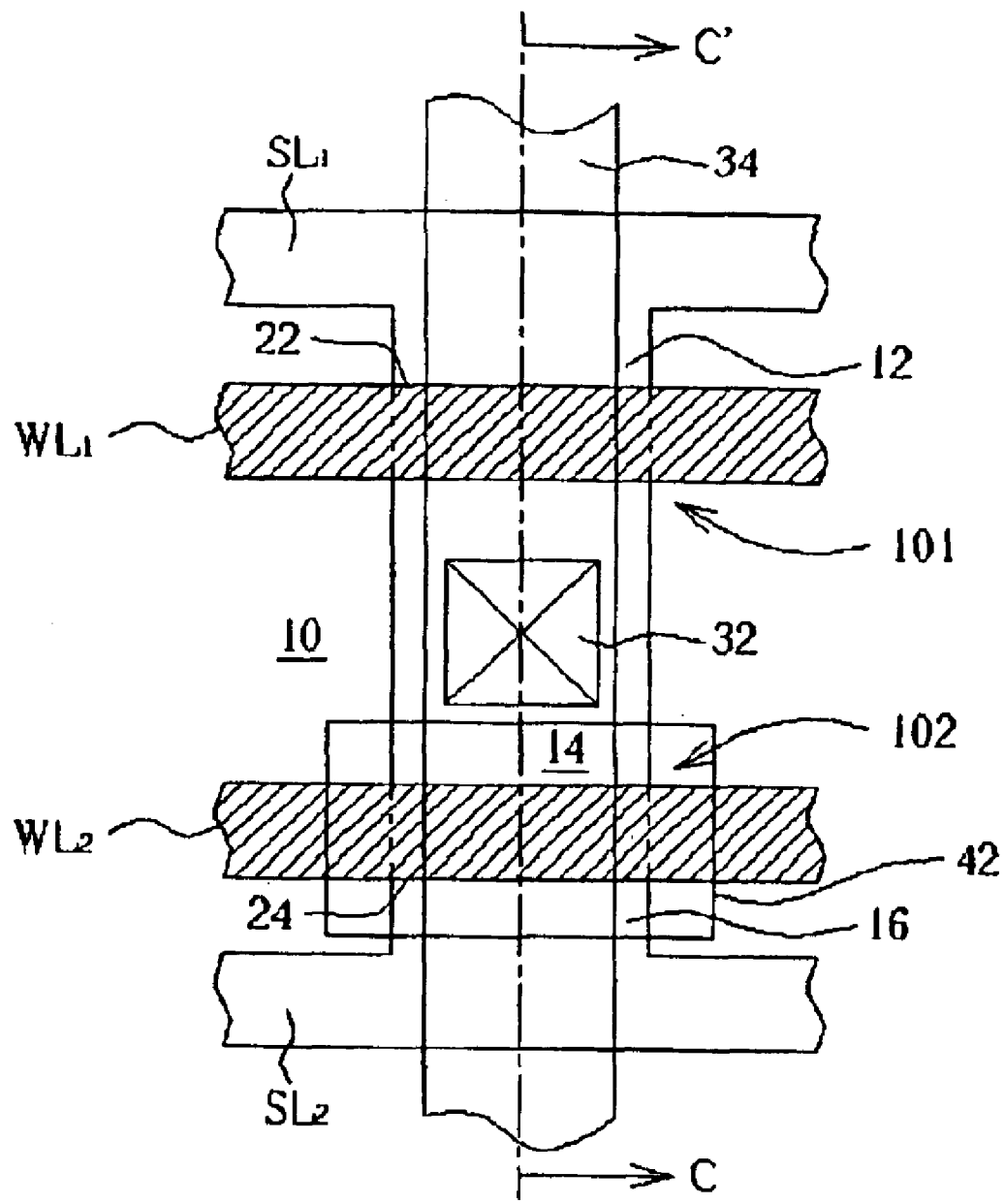
FIG. 5 is an enlarged planar view of the ROM unit layout, after coating a code mask according to the present invention.
Figure 6:
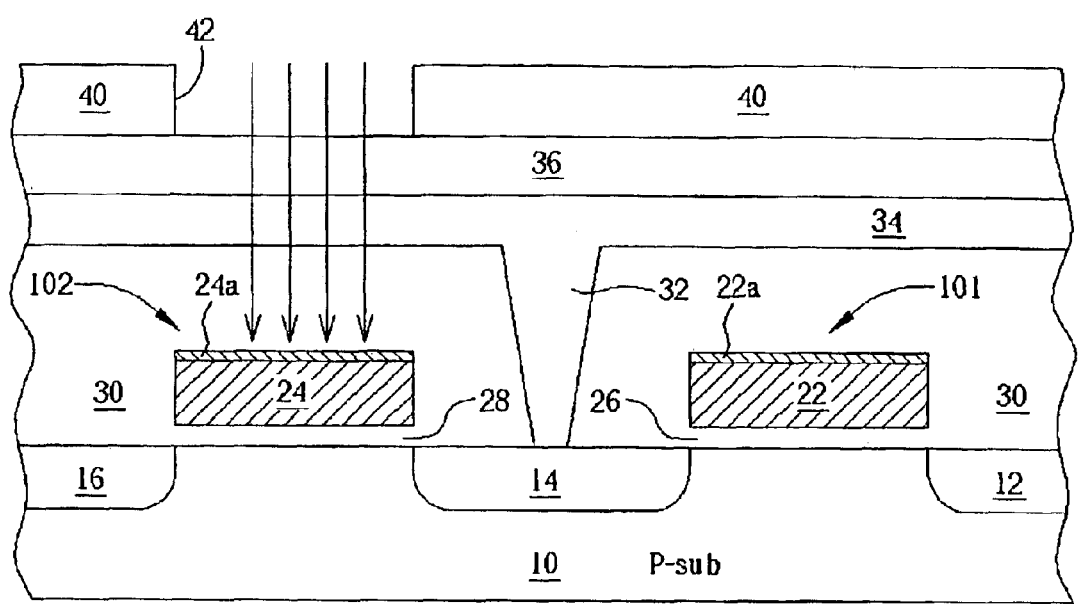
FIG. 6 is a schematic, cross-sectional view of FIG. 5 along line CC".

Please refer to FIG. 5 and FIG. 6. FIG. 5 is an enlarged planar view of the ROM unit layout, after coating a code mask according to the present invention. FIG. 6 is a schematic, cross-sectional view of FIG. 5 along line CC". As shown in FIG. 5 and FIG. 6, a coding photoresist layer 40 is coated on the dielectric layer 36. The coding photoresist layer 40 is exposed to ultraviolet (UV) light through a photo mask which defines the customer ROM code. After development, the unexposed coding photoresist layer 40 is removed leaving a plurality of apertures defining exposure windows 42 where the underlying field-effect transistors are to be coded permanently to an "OFF" state. In this case, the cell 102 is chosen, by way of example, as the transistor to be coded to an "OFF" state and only one window 42 is illustrated. The ROM device is then subjected to boron implantation at a relatively high energy level that is capable of penetrating the dielectric layer 36, the metal bit line 34, dielectric layer 30, salicide layer 24a, polysilicon gate 24, and gate oxide 28. It is understood that the accurate energy level and dosage of the ion implant depend on the thickness of the dielectric layers 30 and 36, metal bit line, polysilicon gate 24 and salicide 24a, gate oxide 28, as well as the desired change in the threshold voltage.

In a case that the N-type polysilicon gate 24 is doped into a P-type gate, the signal through the word line will be conducted via the salicide layer 24a formed on the gate 24 without affecting the performance of the ROM device.

Figure 7:
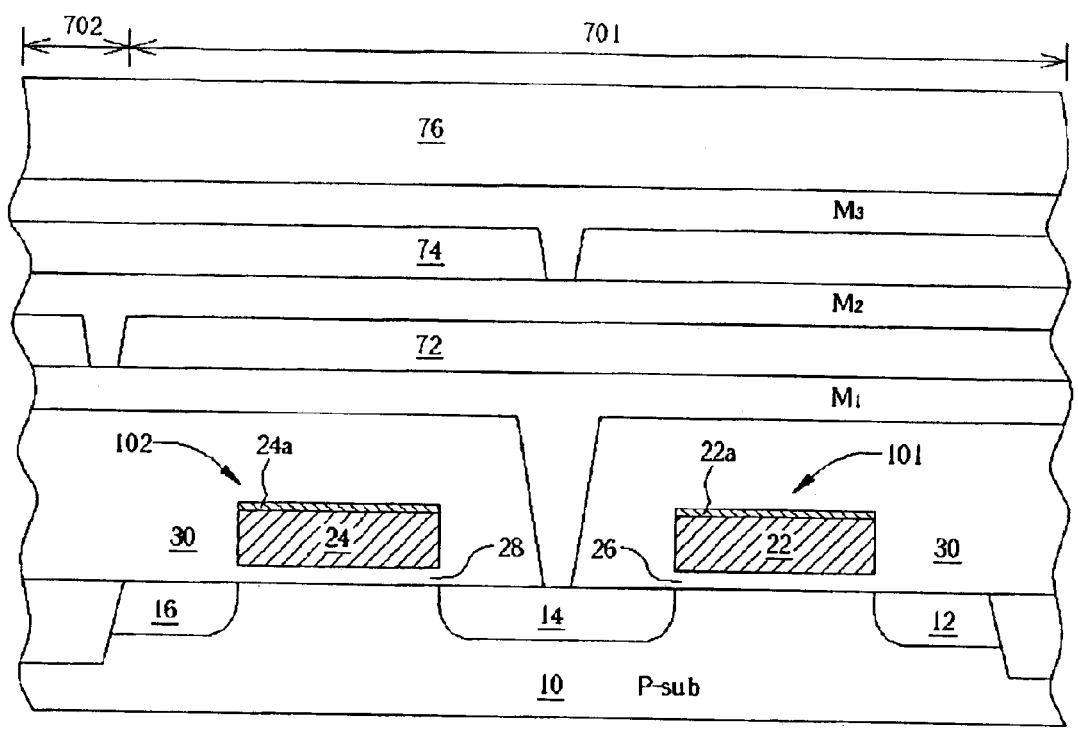
FIG. 7 to FIG. 10 are cross-sectional diagrams illustrating another preferred embodiment according to the present invention.

With reference to FIG. 7 to FIG. 10, another preferred embodiment according to the present invention is illustrated in enlarged cross sectional views, in which like reference numerals designate similar or corresponding elements, regions, and portions. As shown in FIG. 7, a P-type semiconductor substrate 10 having thereon an array of enhancement-mode metal-oxide-semiconductor field-effect transistors (MOSFETS) within a ROM region 701 is provided. Likewise, the ROM array, which may be a 64M ROM or 128M ROM, consists of a huge number of ROM units, and only one ROM unit is shown for simplicity. A dielectric layer 30 is formed to cover the array of MOSFETs within the ROM region 701, wherein each of the MOSFETs has a polysilicon gate, a source, a drain, and a gate oxide between the polysilicon gate and the substrate. All of the MOSFETs are initially in a logic "0" state at a first threshold voltage. The ROM unit shown in FIG. 7 comprises two connected cells 101 and 102. The cell 101 is an N-channel MOS field-effect transistor having a gate 22, a source 12, and a drain 14. A thin gate oxide 26 is disposed under the gate 22. The cell 102 is an N-channel MOS field-effect transistor having a gate 24, a source 16, and the drain 14. A thin gate oxide 28 is disposed under the gate 24. The cells 101 and 102 share the drain region 14 and are thus connected to each other, thereby shrinking the dimension of the ROM unit. As mentioned, both of the cells 101 and 1 02 are initially in a logic "0" state at a first threshold voltage. The gates 22 and 24 are parts of word lines $WL_1$ and $WL_2$, respectively. The sources 12 and 16 are electrically connected to source lines $SL_1$ and $SL_2$, respectively. The source lines $SL_1$ and $SL_2$ are N-type buried diffusion lines formed in the P-type semiconductor substrate 10. Self-aligned silicide (salicide) layers 22a and 24a, which reduce resistance of word lines, are provided on the top surfaces of the gates 22 and 24, respectively. In operation, the sources 12 and 16 are biased to ground or Vss, the gates 22 and 24 are biased to Vcc.

Three layers of metal lines $M_1$, $M_2$ and $M_3$ are sequentially formed within the ROM region 701 overlying the array of memory cells. The first layer of metal line $M_1$, which may be a bit line, is patterned on the dielectric layer 30. The second layer of metal line $M_2$ is formed and patterned on an inter-metal dielectric (IMD) layer 72. The third layer of metal line $M_3$ is formed and patterned on an IMD layer 74. It is noted that the three layers of metal lines are only for illustration purposes. In effect, before storing the ROM device, m layers of metal interconnections may be formed overlying the array of memory cells within the ROM region 701, where m is an integer between 2 and 7 inclusive. After the formation and patterning of the third metal line $M_3$, a protection dielectric layer 76 is deposited to cover the patterned third metal line $M_3$ and the IMD layer 74. After this, the ROM device is stored or "banked". The ROM device is held awaiting the details of a custom's order, which will determine the exact configuration of the code implant.

Figure 8:
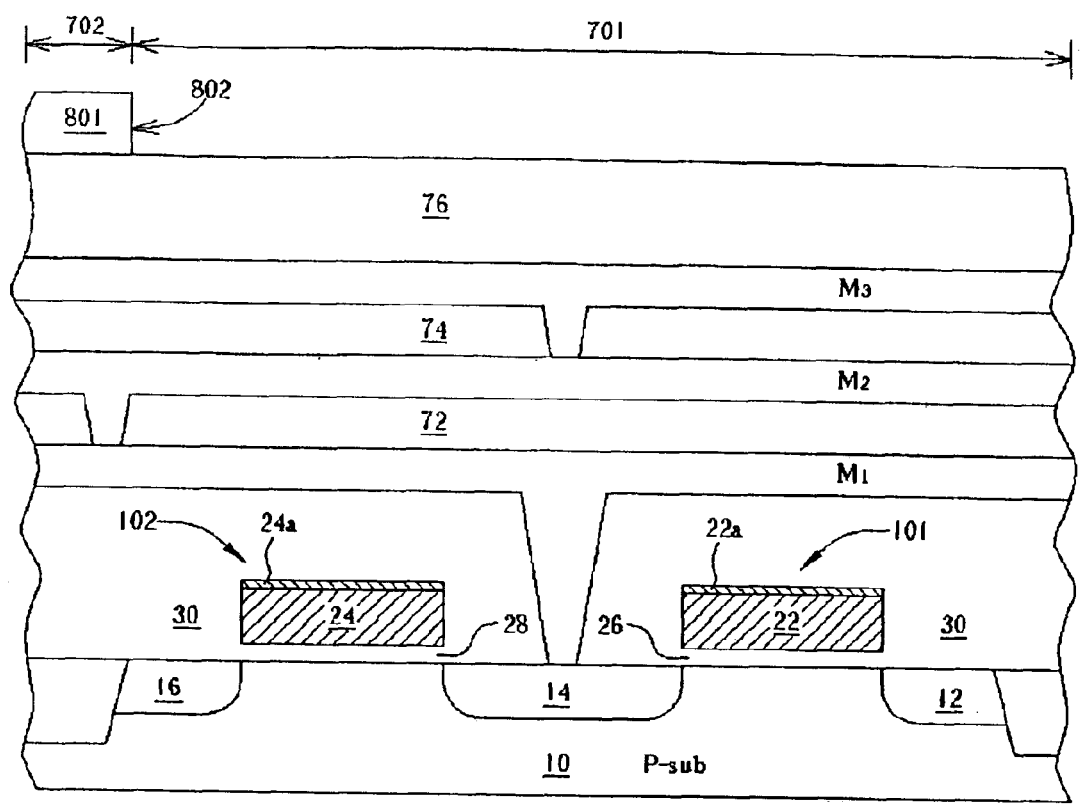
Figure 9:
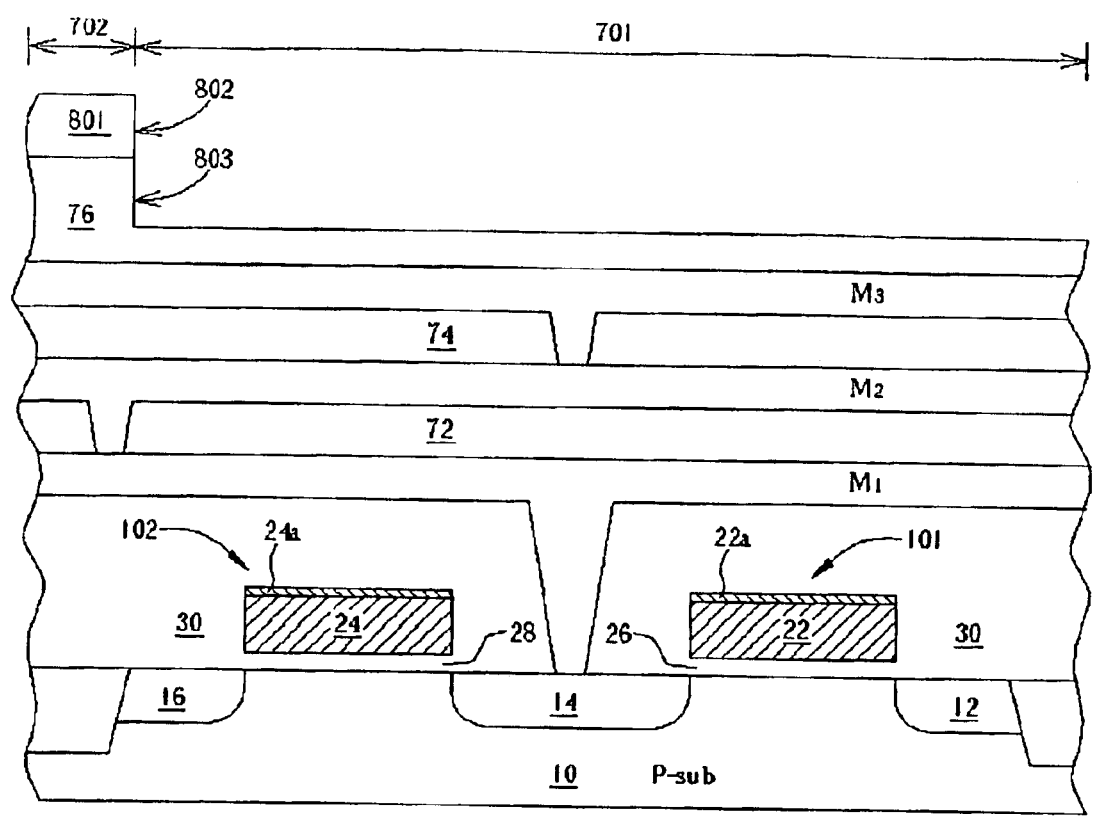
Figure 10:
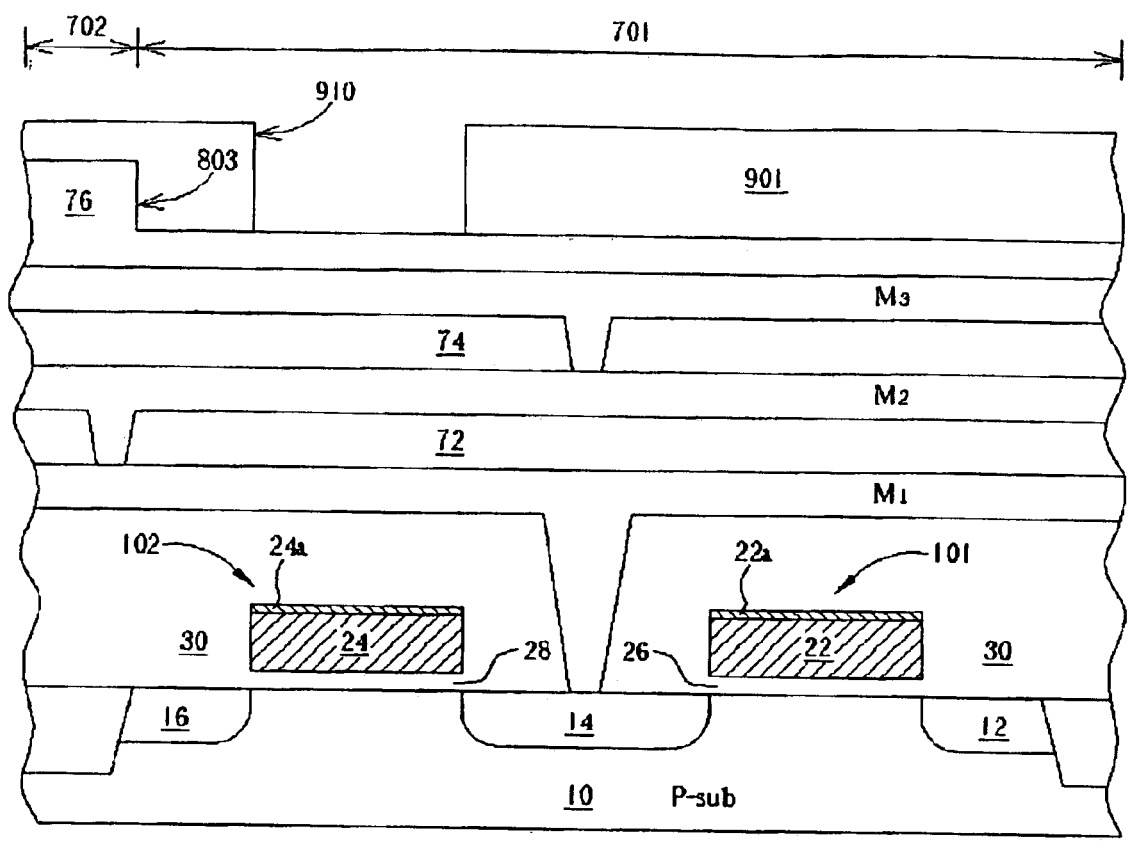

After receiving a ROM code from a custom order, a ROM code mask is prepared. As shown in FIG. 8, a photoresist layer 801 is formed on the protection dielectric layer 76. The photoresist layer 801 has an opening 802 exposing the entire ROM region 701, but masking the peripheral area 702. As shown in FIG. 9, an etching back process is then carried out to etch a thickness of the protection dielectric layer 76 through the opening 802 to a predetermined depth that is determined by a time mode etching operation known in the art to form a recess 803 in the protection dielectric layer 76 over the ROM region 701. The etching back does not expose the third layer of metal line $M_3$.

After stripping the photoresist layer 801, a coding photoresist layer 901 is coated on the protection dielectric layer 76 and in the recess 803. The coding photoresist layer 901 is then exposed to ultraviolet (UV) light through the photo mask which defines the customer ROM code. After development, the unexposed coding photoresist layer 901 is removed leaving a plurality of apertures defining exposure windows where the underlying field-effect transistors are to be coded permanently to an "OFF" state. In this case, the cell 102 is chosen, by way of example, as the transistor to be coded to an "OFF" state and only one window 910 is illustrated. The ROM device is then subjected to boron implantation at a relatively high energy level that is capable of penetrating the thin protection dielectric layer 76 within the ROM region 701, the metal lines $M_1$, $M_2$, $M_3$, IMD layers 72 and 74, dielectric layer 30, salicide layer 24a; polysilicon gate 24, and gate oxide 28. It is understood that the accurate energy level and dosage of the ion implantation depend on the thickness of the IMD layers, metal lines, polysilicon gate, salicide, gate oxide, as well as the desired change in the threshold voltage. Finally, the coding photoresist layer 901 is stripped and a passivation layer (not shown) such as silicon nitride is deposited on the surface of the ROM device for further protection. Alternatively, after stripping the coding photoresist layer 901, for some ROM device such as a 1P7M (one polysilicon gate plus 7 layers of metal) ROM device, repeating IMD deposition and metal patterning are implemented.

In contrast to the prior art, the present invention discloses a method for shrinking the product turn-around time by code implanting the ROM array after the multilevel metal interconnections are formed within the ROM region, which is not taught in the prior art. The code implantation implants impurities such as boron at a relatively high energy level through at least one metal layer, IMD layers, polysilicon gates, salicide layers, gate oxides, into the substrate, thereby changing the threshold voltage of selected transistors.

Those skilled in the art will readily observe that numerous modifications and alterations of the present invention method may be made while retaining the teachings of the invention. Accordingly, the above disclosure should be construed as limited only by the metes and bounds of the appended claims.

What is claimed is:

1. A method for manufacturing a read only memory (ROM) device capable of shortening product turn-around time; the method comprising the steps of:

providing a semiconductor substrate having thereon an array of enhancement-mode metal-oxide-semiconductor field-effect transistors (MOSFETs) within a ROM region and a first dielectric layer covering the MOSFETs within the ROM region, wherein each of the MOSFETs has a polysilicon gate, a source, a drain, and a gate oxide between the polysilicon gate and the substrate, and wherein all of the MOSFETs are initially in a logic "0" state at a first threshold voltage;

forming m layers of metal interconnections over the first dielectric layer within the ROM region, wherein the top layer of the m layers of metal interconnections is covered by a second dielectric layer;

forming a mask layer on the second dielectric layer, the mask layer having an opening exposing the entire ROM region;

etching away a thickness of the second dielectric layer through the opening without exposing the top layer of the m layers of metal interconnections to form a recess over the ROM region;

removing the mask layer;

forming a coding photoresist layer on the second dielectric layer in the recess;

patterning the coding photoresist layer to form a plurality of apertures defining exposure windows where the underlying MOSFETs are to be coded from the logic "0" state into a logic "1" state;

using the patterning coding photoresist layer as an implant hard mask to implant the underlying MOSFETs to be coded through the apertures, m layers of metal interconnections, polysilicon gates, and gate oxides into the substrate, thereby transforming the MOSFETs to be coded into the logic "1" state to a second threshold voltage, wherein the second threshold voltage is higher than the first threshold voltage; and stripping the coding photoresist layer.

2. The method of claim 1 wherein m is an integer between 1 to X, where X is the total number of metal layers of the ROM device and X is larger than m, and wherein the m+1 layer metal interconnection to the X layer metal interconnection is formed outside the ROM region.

3. The method of claim 1 wherein after covering the top layer of the m layers of metal interconnections by a second dielectric layer, the ROM device is stored in a condition awaiting a customer's ROM code.

4. The method of claim 1 wherein after stripping the coding photoresist layer, the method further comprises:

depositing a passivation layer overlying the second dielectric layer.

5. The method of claim 4 wherein the passivation layer is composed of silicon nitride.

6. A method for manufacturing a read only memory (ROM) device, the method comprising:

providing a semiconductor substrate having thereon an array of field-effect transistors within a ROM region and a first dielectric layer covering the array of field-effect transistors, wherein all of the field-effect transistors are initially in an "ON" state having a threshold voltage at a first value;

forming at least one layer of metal interconnection over the first dielectric layer within the ROM region, wherein the layer of metal interconnection is covered by a second dielectric layer;

forming a coding photoresist layer on the second dielectric layer;

patterning the coding photoresist layer to form a plurality of apertures defining exposure windows where the underlying field-effect transistors are to be coded permanently to an "OFF" state;

using the patterned coding photoresist layer as an implant hard mask to implant the underlying field-effect transistors to be coded through the apertures, the layer of metal interconnections, polysilicon gates, and gate oxides into the substrate, thereby raising the threshold voltage of the field-effect transistors to be coded to a second value; and stripping the coding photoresist layer.

7. The method of claim 6 wherein before forming the coding photoresist layer on the second dielectric layer, the method further comprises the steps of:

forming a mask layer on the second dielectric layer, the mask layer having an opening exposing the entire ROM region;

etching away a thickness of the second dielectric layer through the opening without exposing the layer of metal interconnection to form a recess over the ROM region; and removing the mask layer.

8. The method of claim 7 wherein the coding photoresist layer is formed in the recess.

9. The method of claim 6 wherein m layers of metal interconnections are formed over the first dielectric layer within the ROM region, and the top layer of the m layers of metal interconnections is covered by the second dielectric layer.

10. The method of claim 6 wherein each of the field-effect transistors has a polysilicon gate, a source, a drain, and a gate oxide between the polysilicon gate and the substrate.

11. The method of claim 6 wherein after covering the layer of metal interconnection by the second dielectric layer, the ROM device is stored in a condition awaiting a customer's ROM code.

12. The method of claim 6 wherein after stripping the coding photoresist layer, the method further comprises:

depositing a passivation layer overlying the second dielectric layer.

13. A method for, manufacturing a read only memory (ROM) device, the method comprising:

providing a semiconductor substrate having thereon an array of field-effect transistors within a ROM region and a first dielectric layer covering the array of field-effect transistors, wherein all of the field-effect transistors are initially in an "ON" state having a threshold voltage at a first value;

forming at least one layer of metal interconnection over the first dielectric layer within the ROM region, wherein the layer of metal interconnection is covered by a composite dielectric;

forming a coding photoresist layer on the composite dielectric:

patterning the coding photoresist layer to form a plurality of apertures defining exposure windows where the underlying field-effect transistors are to be coded permanently to an "OFF" state;

using the patterned coding photoresist layer as an etching hard mask to etch the composite dielectric through the apertures;

using the coding photoresist layer as an implant hard mask to implant the underlying field-effect transistors to be coded through the apertures, the layer of metal interconnections, polysilicon gates, and gate oxides into the substrate, thereby raising the threshold voltage of the field-effect transistors to be coded to a second value; and stripping the coding photoresist layer.

14. The method of claim 13 wherein after forming the composite dielectric, the ROM device is stored in a condition awaiting a customer's ROM code.

* * * * *